United States Patent
Aizawa

(10) Patent No.: US 9,362,881 B2
(45) Date of Patent: Jun. 7, 2016

(54) NOISE FILTER DEVICE

(71) Applicants: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

(72) Inventor: Takeshi Aizawa, Yokkaichi (JP)

(73) Assignees: AUTONETWORKS TECHNOLOGIES, LTD. (JP); SUMITOMO WIRING SYSTEMS, LTD. (JP); SUMITOMO ELECTRIC INDUSTRIES, LTD. (JP)

(*) Notice: Subject to any disclaimer, the term of this patent is extended or adjusted under 35 U.S.C. 154(b) by 0 days.

(21) Appl. No.: 14/321,227

(22) Filed: Jul. 1, 2014

(65) Prior Publication Data

US 2015/0008989 A1    Jan. 8, 2015

(30) Foreign Application Priority Data

Jul. 8, 2013    (JP) .................................. 2013-142442

(51) Int. Cl.
*H03H 7/01*    (2006.01)
*H03H 1/00*    (2006.01)

(52) U.S. Cl.
CPC ........... *H03H 7/0115* (2013.01); *H03H 1/0007* (2013.01); *H03H 2001/0035* (2013.01)

(58) Field of Classification Search
CPC .................. H03H 7/01; H03H 7/0115; H03H 2001/0035; H03H 1/007
USPC .......................................... 333/185, 175, 181
See application file for complete search history.

(56) References Cited

U.S. PATENT DOCUMENTS

2009/0115551 A1    5/2009    Kobayashi et al.
2012/0081194 A1*   4/2012    Nishioka et al. .............. 333/185

FOREIGN PATENT DOCUMENTS

WO    2007020902    2/2007

* cited by examiner

*Primary Examiner* — Benny Lee
*Assistant Examiner* — Albens Dieujuste
(74) *Attorney, Agent, or Firm* — Gerald E. Hespos; Michael J. Porco; Matthew T. Hespos

(57) ABSTRACT

A noise filter device includes a ground connection terminal (21) for grounding, a coil (31) formed by winding a conductive wire (33), a pair of capacitors (41) constituting a π-type filter circuit C together with the coil (31) and to be electrically connected to the ground connection terminal (21), and a housing (11) capable of housing the coil (31) and the pair of capacitors (41). The capacitors are both arranged on one surface side of a virtual plane dividing the coil into two in an axial direction, and a conductive shielding plate (24B) to be grounded to the ground connection terminal (21) is interposed between the capacitors (41).

14 Claims, 5 Drawing Sheets

NOISE FILTER DEVICE

BACKGROUND OF THE INVENTION

1. Field of the Invention

The present invention relates to a noise filter device.

2. Description of the Related Art

A vehicle-mounted noise filter device is required to be small in size and light in weight due to the restriction of an installation space thereof. WO 2007/020902 discloses a noise filter device having an enhanced noise removal ability by adopting a π-type filter circuit using a pair of capacitors and a coil while realizing a small size and a high heat radiation property.

However, the π-type filter circuit has a problem that electric field coupling is caused if the capacitors are close to each other and a noise removal characteristic is reduced due to the generation of a coupling capacitance. Further, if the capacitors are distanced from each other to suppress electric field coupling, there is a problem of enlarging the noise filter device.

The present invention was completed based on the above situation and aims to provide a noise filter device that is small in size and suppresses electric field coupling.

SUMMARY OF THE INVENTION

The invention is directed to a noise filter device, including a ground connection terminal for grounding, a coil formed by winding a conductive wire and a pair of capacitors. The capacitors and the coil constitute a π-type filter circuit, and the capacitors are connected electrically to the ground connection terminal. The noise filter device further has a housing capable of housing the coil and the pair of capacitors. Both capacitors are arranged on one surface of a virtual plane dividing the coil in two in an axial direction. A conductive shielding plate is connected to the ground connection terminal and is interposed between the capacitors of the π-type filter circuit. Thus, electric field coupling and the generation of a coupling capacitance associated with the electric field coupling can be suppressed even if the capacitors are not distanced from each other. Further, the arrangement of both capacitors eccentrically on one surface side of the virtual plane dividing the coil into two in the axial direction reduces an installation space in a direction perpendicular to the axial direction of the coil as compared with the case where the capacitors are arranged separately on opposite sides of the coil in the axial direction.

The two capacitors that comprise the pair of capacitors of the noise filter device of the invention preferably are juxtaposed in the axial direction of the coil. Accordingly, the noise filter device can be made smaller.

The conductive shielding plate of the noise filter device preferably is integral with the ground connection terminal so that the conductive shielding plate suppresses electric field coupling and also grounds the capacitors. Therefore, the configuration of the noise filter device is simplified, and the number of components is reduced.

The conductive shielding plate preferably is interposed between the coil and the capacitors. Accordingly, heat generated by the coil can be radiated to the outside through the conductive shielding plate. Thus, characteristic deterioration of the capacitors caused by heat can be prevented.

The coil of the noise filter device of the invention preferably is wound so that end parts of the conductive wire at opposite ends of the coil in the axial direction are pulled out in the same direction and at the same height. Accordingly, an operation of connecting the conductive wire of the coil and the capacitors is facilitated.

The housing of the noise filter device preferably is formed to fit to a mating connector and terminal fittings serving as input and output sections of the π-type filter circuit are provided in a part of the housing to be fit to the mating connector. According to this configuration, the noise filter device can be used as a connector including the input and output sections (terminal fittings) for the π-type filter circuit.

First and second embodiments of a noise filter device of the invention are described with reference to the drawings.

DETAILED DESCRIPTION OF THE PREFERRED EMBODIMENTS

Figure 1:
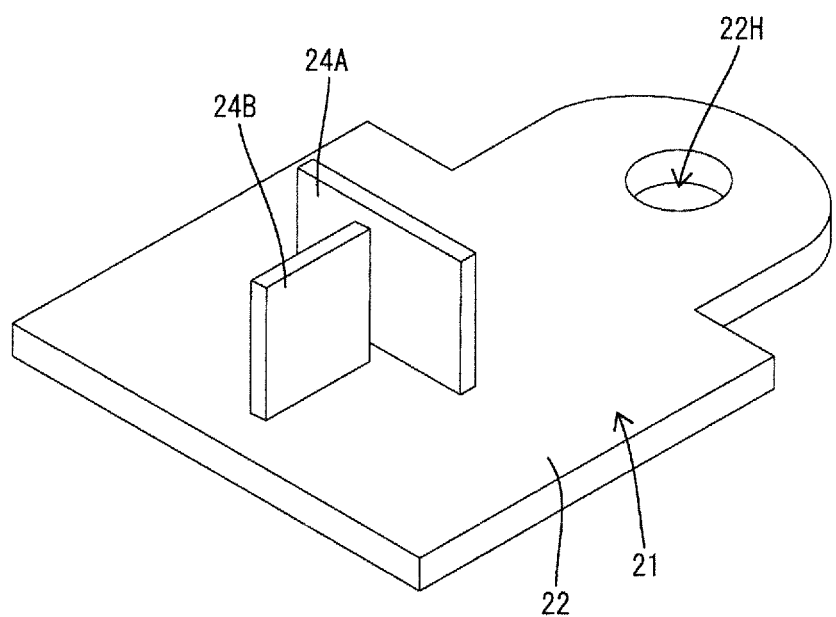
FIG. 1 is a perspective view of a ground connection terminal according to a first embodiment.
Figure 2:
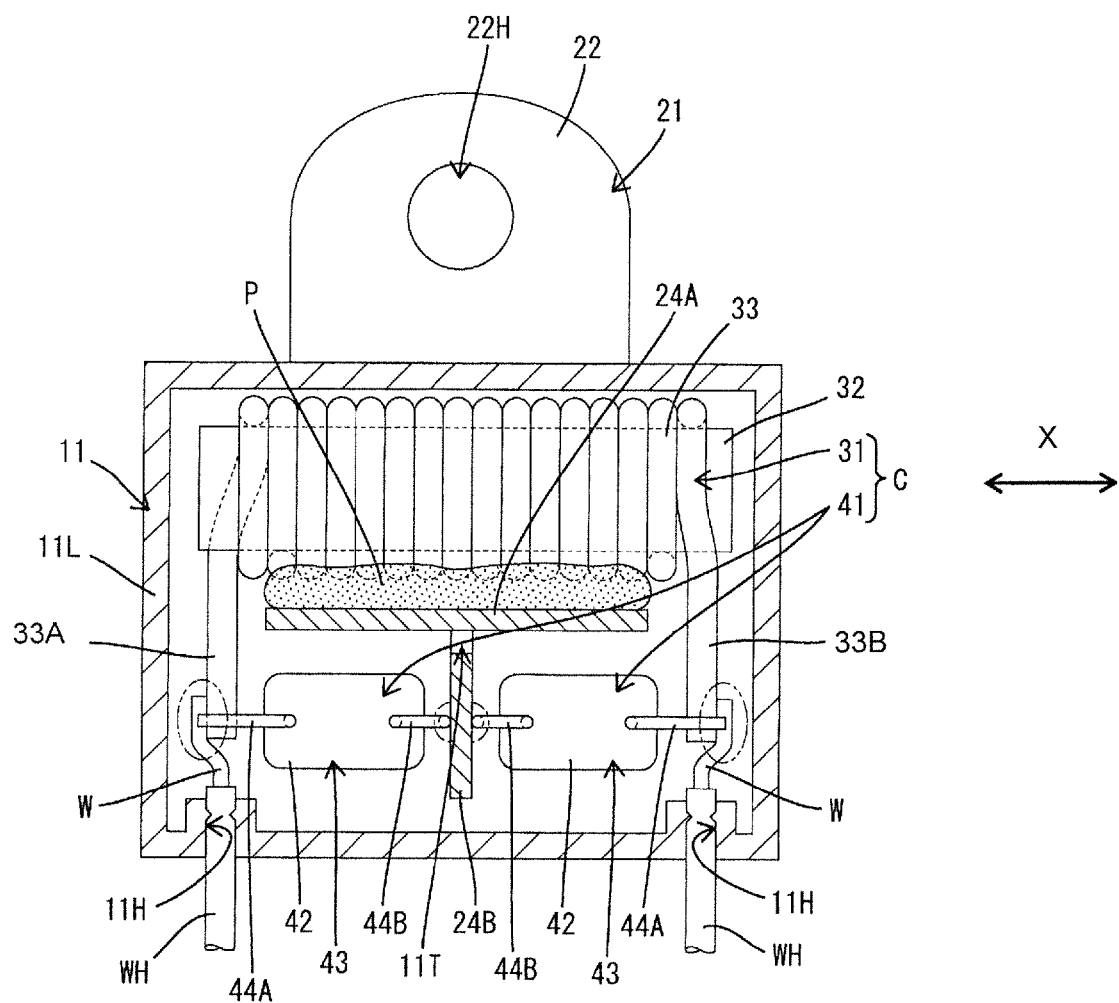
FIG. 2 is a cross-sectional view of a noise filter device according to the first embodiment.
Figure 3:
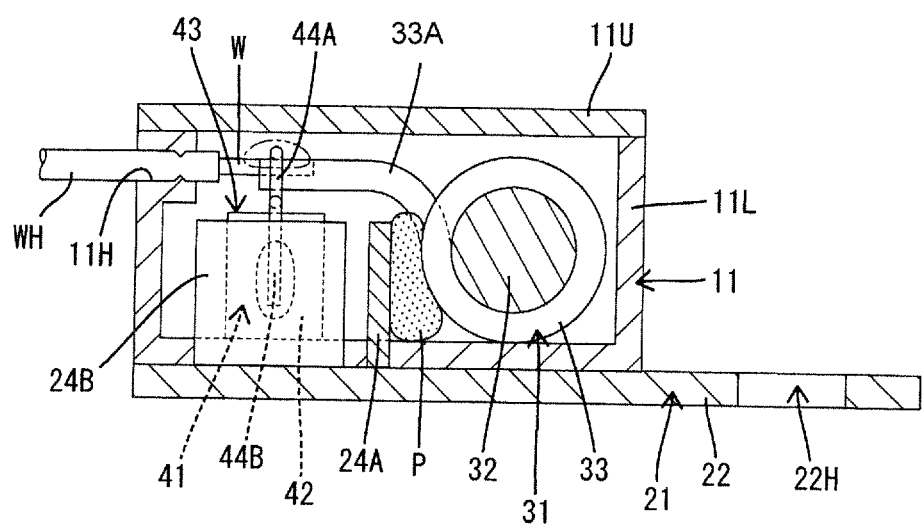
FIG. 3 is a side view in section of the noise filter device of FIG. 2.

A noise filter device of the first embodiment, which relates to FIGS. 1-3, includes a ground connection terminal 21, a coil 31, a pair of capacitors 41, conductive shielding plates 24A, 24B, and a housing 11. In the following description, lower and upper sides of FIG. 2 are respectively referred to as front and rear sides concerning a front-back direction.

The housing 11 is made of synthetic resin and comprises a box-shaped lower housing 11L with an upper opening and an upper housing 11U capable of closing the upper opening. Two insertion holes 11H are formed on the front surface of the lower housing 11L and wires WH for input and output are insertable therein. A substantially T-shaped through hole 11T is formed on the lower surface of the lower housing 11L, and the conductive shielding plates 24A, 24B can be housed into the interior through the through hole 11T.

The ground connection terminal 21 is formed by punching a conductive plate material such as copper alloy and bending a punched piece to form a flat ground plate 22 and two conductive shielding plates 24A, 24B projecting on the ground plate 22, as shown in FIG. 1.

The ground plate 22 is arranged on the lower surface of the lower housing 11L to cover the entire lower surface of the lower housing 11L. Further, the ground plate 22 protrudes back from the lower housing 11L and a tip part thereof has a semicircular shape. A perfectly circular bolt hole 22H is open substantially in the center of the tip part of the ground plate 22. The noise filter device can be bolt-fastened to a vehicle body panel (ground point) via the bolt hole 22H.

The two conductive shielding plates 24A, 24B are arranged orthogonally to form a T shape in a plan view of FIG. 1. Further, a height of the first conductive shielding plate 24A is slightly shorter than that of the coil 31.

The coil 31 is formed by winding a conductive wire 33 around a cylindrical magnetic core 32. Further, as shown in FIGS. 2 and 3, opposite end parts 33A, 33B of the conductive wire 33 are pulled out to a predetermined height in the same direction (forward in FIG. 2).

The pair of capacitors 41 and the coil 31 constitute a π-type filter circuit C, and capacitors having the same type and capacitance are used as such. The capacitors 41 are both film capacitors and each includes a capacitor main body 42 substantially in the form of a block. Positive and negative electrode lead wires 44A, 44B are drawn out from a pull-out surface 43 of the capacitor main body 42. Since the film capacitor has no polarity, the positive and negative electrode lead wires 44A, 44B have the same length.

The first and second conductive shielding plates 24A, 24B of the ground connection terminal 21 are fit into the T-shaped through hole 11T provided on the lower surface of the lower housing 11L, thereby uniting the lower housing 11L and the ground connection terminal 21. The interior of the lower housing 11L is partitioned by the respective conductive shielding plates 24A, 24B projecting from the through hole 11T. The coil 31 then is housed behind the first conductive shielding plate 24A (see FIG. 2). At this time, the coil 31 is arranged so that the opposite end parts 33A, 33B of the conductive wire 33 thereof are pulled forward. The two capacitors 41 then are housed before the first conductive shielding plate 24A and at opposite sides of the second conductive shielding plate 24B. At this time, the capacitors 41 are oriented so that the pull-out surfaces 43, from which the lead wires 44A, 44B of the capacitors 41 are pulled out, face upward.

Epoxy resin P is poured to bridge between the coil 31 and the first conductive shielding plate 24A to fix the coil 31 in the lower housing 11L. The epoxy resin P is mixed with AlN (aluminum nitride) filler and has high thermal conductivity. At this time, a filling operation is performed with a predetermined space provided between the conductive wire 33 of the coil 31 and the first conductive shielding plate 24A to prevent contact. A wiring operation is performed to form the π-type filter circuit C after the fixing operation of the coil 31 in the lower housing 11L is finished. First, the wires WH for input and output are inserted through the insertion holes 11H on the front side of the lower housing 11L. Then, as shown in FIG. 2, the positive electrode lead wires 44A of the respective capacitors 41 and conductive wires C of the respective wires WH are connected to the opposite end parts 33A, 33B of the conductive wire 33 pulled out from the coil 31 by soldering while being held in contact. Further, the negative electrode lead wires 44B of the respective capacitors 41 are connected to the second conductive shielding plate 24B projecting from the lower housing 11L by soldering while being held in contact, thereby completing the connection of the π-type filter circuit C. Finally, the assembling of the noise filter device is completed by closing the upper opening of the lower housing 11L by the upper housing 11U.

According to this embodiment, the second conductive shielding plate 24B integral to the ground connection terminal 21 is arranged between the pair of capacitors 41 of the π-type filter circuit C to suppress electric field coupling between the capacitors 41 and the generation of a coupling capacitance associated with the electric field coupling. Further, it is not necessary to distance the capacitors 41 from each other to suppress electric field coupling so that the noise filter device easily is made smaller in size.

Further, the capacitors of the pair of capacitors 41 are arranged before the coil 31 and are juxtaposed in an axial direction of the coil 31. Thus, an installation space can be made smaller in a direction perpendicular to the axial direction of the coil 31 as compared with the case where the capacitors 41 are arranged at opposite sides of the coil 31 in the axial direction in conformity with an element arrangement (C-L-C) of the π-type filter circuit C.

Furthermore, the second conductive shielding plate 24B is integral to the ground connection terminal 21. Thus, the respective capacitors 41 can be grounded collectively via the second conductive shielding plate 24B by connecting the negative electrode lead wires 44B of the respective capacitors 41 to the second conductive shielding plate 24B. A separate grounding means is not needed for each capacitor 41, and therefore the configuration is simple.

Further, the first conductive shielding plate 24A that is integral to the ground connection terminal 21 is interposed between the coil 31 and each capacitor 41. This can suppress unintended electric field coupling between the coil 31 and the capacitors 41 and makes the transfer of heat generated by the coil 31 to the capacitors 41 difficult. Thus, characteristic deterioration associated with a temperature increase of the capacitors 41 can be prevented.

Further, the opposite end parts 33A, 33B of the conductive wire 33 of the coil 31 are pulled out in the same direction and at the same height. This facilitates a connecting operation of the coil 31, the capacitors 41 and the wires WH serving as input and output terminals.

Figure 4:
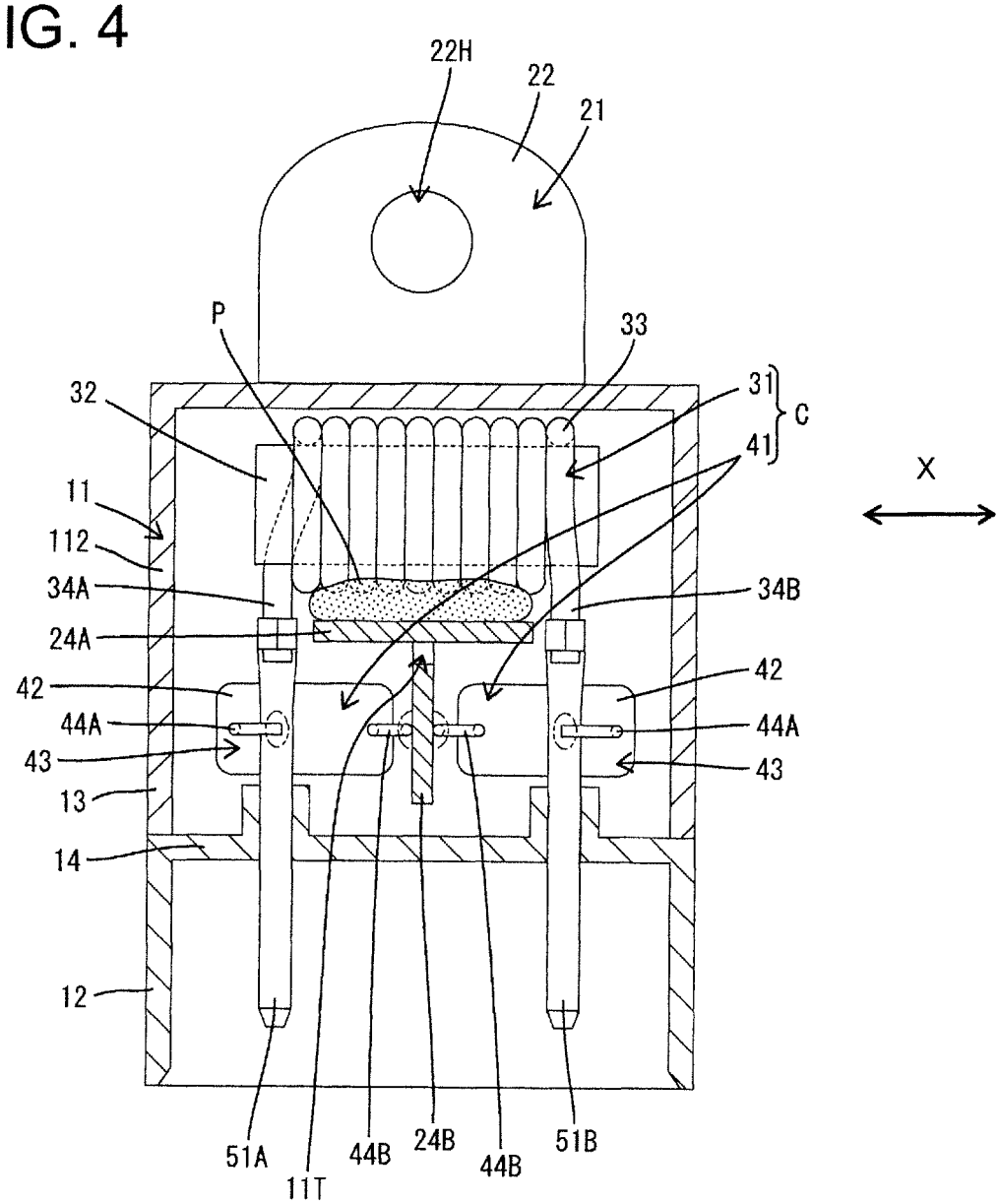
FIG. 4 is a plan view of a noise filter device according to a second embodiment.
Figure 5:
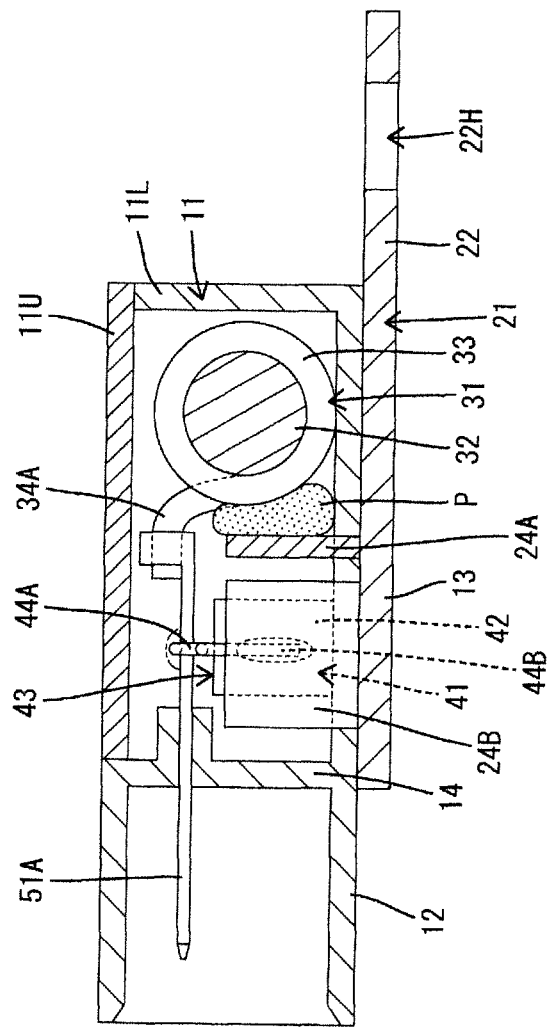
FIG. 5 is a side view in section of the noise filter device of FIG. 4.

In a second embodiment relating to FIGS. 4-5, the noise filter device of the present invention is applied to a connector and includes a ground connection terminal 21, a coil 31, a pair of capacitors 41, conductive shielding plates 24A, 24B, a housing 11 and busbar terminals (terminal fittings) 51A, 51B. In the following description, lower and upper sides of FIG. 4 are respectively referred to as front and rear sides concerning the front-back direction.

The housing 11 has a box-shaped lower housing 11L with upper and front openings and an upper housing 11U capable of closing the upper opening. The united housing 11 is partitioned into a rectangular tubular receptacle 12 and a filter housing 13. The receptacle can fit to an unillustrated mating connector.

As shown in FIG. 4, tab-shaped positive and negative electrode busbar terminals 51A, 51B made of copper alloy are held and fixed to a partition wall 14 between the receptacle 12 and the filter housing 13 by insert molding. Tips of the respective busbar terminals 51A, 51B project into the receptacle 12, and rear end parts connected to a π-type filter circuit C project into the filter housing 13.

The π-type filter circuit C similar to the one mounted in the lower housing 11L of the first embodiment is housed in the filter housing 13. The other configuration is as in the first embodiment and can exhibit similar functions and effects.

As described above, according to the present invention, it is possible to obtain a noise filter device that is small in size and suppresses electric field coupling.

The invention is not limited to the above described and illustrated embodiments. For example, the following embodiments are also included in the technical scope of the present invention.

Although the film capacitors are used as the capacitors in the above embodiments, electrolytic capacitors or ceramic capacitors may be used.

Although the capacitors used include the lead wires in the above embodiments, the capacitors may not include the lead wires.

Although the ground connection terminal and the conductive shielding plates are integrally formed in the above embodiments, they may be separate bodies.

Although two capacitors are juxtaposed in the axial direction of the coil in the above embodiments, they may be juxtaposed in a direction intersecting with the axial direction of the coil. Further, the capacitors may be stacked in the housing.

Although the tab-shaped busbar terminals are used as the terminal fittings in the above second embodiment, other male terminal fittings or female terminal fittings may be used.

Although two terminal fittings are used in the above embodiments, three or more terminal fittings may be provided.

Although the capacitors and the coil are connected by soldering in the above embodiments, they may be connected such as by laser welding or resistance welding.

What is claimed is:

1. A noise filter device, comprising:
   a ground connection terminal for grounding;
   a coil formed by winding a conductive wire;
   a pair of capacitors constituting a π-type filter circuit together with the coil and to be electrically connected to the ground connection terminal; and
   a housing capable of housing the coil and the pair of capacitors;
   wherein the pair of capacitors are both arranged on one side of a virtual plane dividing the coil into two in an axial direction, and a conductive shielding plate connected to the ground connection terminal is interposed between the capacitors;
   wherein the pair of capacitors are juxtaposed in an orientation parallel with the axial direction of the coil.

2. The noise filter device of claim 1, wherein the housing is formed to fit to a mating connector, and terminal fittings serving as input and output sections of the π-type filter circuit are provided in a part of the housing to be fitted to the mating connector.

3. The noise filter device of claim 1, wherein the conductive shielding plate is integrally formed with the ground connection terminal.

4. The noise filter device of claim 1, wherein a second conductive shielding plate is interposed between the coil and the pair of capacitors.

5. The noise filter device of claim 1, wherein the coil is wound so that end parts of the conductive wire at opposite ends of the coil in the axial direction extend in the same direction and at the same height.

6. A noise filter comprising:
   a ground connection terminal configured to provide an electrical ground potential;
   a coil having a conductive wire wound around a magnetic core;
   a pair of capacitors each having one terminal electrically connected to the ground connection terminal, the pair of capacitors and coil together constituting a π-type filter circuit;
   a housing configured to house the coil and the pair of capacitors;
   a first conductive shielding plate interposed between the pair of capacitors, the first conductive shielding plate being electrically connected to the ground connection terminal; and
   a second conductive shielding plate interposed between the coil and the pair of capacitors, the second conductive shielding plate being electrically connected to the ground connection terminal;
   wherein both capacitors are arranged on one side of a virtual plane that virtually divides the coil in two equal and symmetrical parts, the virtual plane extending along a longitudinal axis of the coil; and
   wherein the first and second conductive shielding plates are integrally formed with the ground connection terminal.

7. The noise filter of claim 6, wherein the housing is configured to fit to a mating connector, and terminal fittings serving as input and output sections of the π-type filter circuit are provided in a part of the housing to be fitted to the mating connector.

8. The noise filter of claim 6, wherein the pair of capacitors are juxtaposed in an orientation parallel with the longitudinal axis of the coil.

9. The noise filter of claim 6, wherein first and second ends of the conductive wire extend in the same direction and at the same height above the ground connection terminal.

10. A noise filter circuit comprising:
    a ground connection terminal for grounding;
    a coil formed by winding a conductive wire;
    a pair of capacitors constituting a π-type filter circuit together with the coil and to be electrically connected to the ground connection terminal; and
    a housing capable of housing the coil and the pair of capacitors;
    wherein the pair of capacitors are both arranged on one side of a virtual plane dividing the coil into two in an axial direction, and a conductive shielding plate connected to the ground connection terminal is interposed between the capacitors; and
    wherein the coil is wound so that end parts of the conductive wire at opposite ends of the coil extend in the same direction and at the same height.

11. The noise filter circuit of claim 10, wherein the housing is formed to fit to a mating connector, and terminal fittings serving as input and output sections of the π-type filter circuit are provided in a part of the housing to be fitted to the mating connector.

12. The noise filter circuit of claim 10, wherein the pair of capacitors are juxtaposed in an orientation parallel with the axial direction of the coil.

13. The noise filter circuit of claim 10, wherein the conductive shielding plate is integrally formed with the ground connection terminal.

14. The noise filter circuit of claim 10, wherein a second conductive shielding plate is interposed between the coil and the pair of capacitors.

* * * * *